United States Patent [19]

Pace et al.

[11] Patent Number: 4,961,006
[45] Date of Patent: Oct. 2, 1990

[54] INDUCTIVELY LOADED SWITCHING TRANSISTOR CIRCUIT

[75] Inventors: Gary L. Pace; David H. Overton, both of Boca Raton, Fla.

[73] Assignee: Motorola, Inc., Schaumburg, Ill.

[21] Appl. No.: 369,877

[22] Filed: Jun. 22, 1989

[51] Int. Cl.⁵ .................. H03K 3/01; H03K 17/60; G05F 1/40; G05F 3/16
[52] U.S. Cl. .................. 307/270; 307/253; 307/299.2; 323/289; 323/315
[58] Field of Search ............. 307/253, 270, 314, 254, 307/299.2; 323/312, 315, 289

[56] References Cited

U.S. PATENT DOCUMENTS 4,609,980 9/1986 Hoffman ..................... 323/289

*Primary Examiner*—Stanley D. Miller
*Assistant Examiner*—Trong Quang Phan
*Attorney, Agent, or Firm*—William E. Koch; Vincent B. Ingrassia

[57] ABSTRACT

An inductively loaded switching transistor circuit for use in the DC-DC converter includes an inductive load and a switching transistor coupled to the inductive load for conducting current flowing therethrough when the switching transistor is on. A drive circuit is provided which is coupled to the switching transistor for supplying a drive current thereto, and feedback means are provided for adjusting the amount of base drive supplied to the switching transistor from the drive circuit. The drive current is varied substantially linearly with respect to the current flowing through the inductive load.

10 Claims, 2 Drawing Sheets

INDUCTIVELY LOADED SWITCHING TRANSISTOR CIRCUIT

BACKGROUND OF THE INVENTION

This invention relates generally to switching transistor circuits, and more particularly to an improved inductively loaded switching transistor circuit with automatic base current control.

In the case of portable communication systems such as selective call receivers or pagers, battery life is one of the key parameters which will ultimately determine the success or failure of a product in the marketplace. It is therefore essential that current drain be minimized.

Certain radio pagers known in the prior art utilize a DC-DC switching regulator power supply to generate a voltage B++ from a single cell battery (B+). U.S. Pat. No. 4,355,277 entitled "Dual Mode DC/DC Converter" describes a DC-DC converter circuit wherein the base drive current for the switching transistor in each mode must be set to a worst case (high) value in order to assure performance under all circumstances which may vary due to variations in B+, coil resistance, B++ load current, etc. This results in wasted current which reduces circuit efficiency thus negatively impacting product battery life.

U.S. Pat. No. 4,056,734 entitled "Compensated Base Drive Circuit to Regulate Saturated Transistor Current Gain" described a single-ended self-oscillating DC-DC converter which includes base drive compensation circuitry. The compensation circuitry is active during saturation intervals of the power transistor to control its forced current gain to some fixed value irrespective of the magnitude of the saturated current flowing through the transistor. Unfortunately, this circuit is not optimized for minimum current drain since base current is only diverted from the base of the switching transistor.

SUMMARY OF THE INVENTION

It is an object of the present invention to provide an improved switching circuit.

It is yet a further object of the present invention to provide an improved switching circuit which exhibits faster switching time while minimizing current drain.

It is a further object of the present invention to provide an inductively loaded switching transistor circuit wherein the switching transistor's base drive current is controlled by sensing the current through the inductor and varying the base drive current accordingly.

According to a broad aspect of the invention there is provided an inductively loaded switching circuit comprising an inductive load; switching transistor means for conducting current flowing through the inductive load, the switching transistor means having a first emitter for coupling to a first source of supply voltage; a drive circuit coupled to said switching transistor means for supplying a drive current thereto; and feedback means coupled to a second emitter of the switching transistor means and to the drive circuit for varying the drive current. In this manner, the drive current is varied almost linearly with respect to the current flowing through the inductive load.

BRIEF DESCRIPTION OF THE DRAWING

The above and other objects, features and advantages of the present invention will be more clearly understood from the following detailed description taken in conjunction with the accompanying drawings in which.

DESCRIPTION OF THE PREFERRED EMBODIMENT

Figure 1:
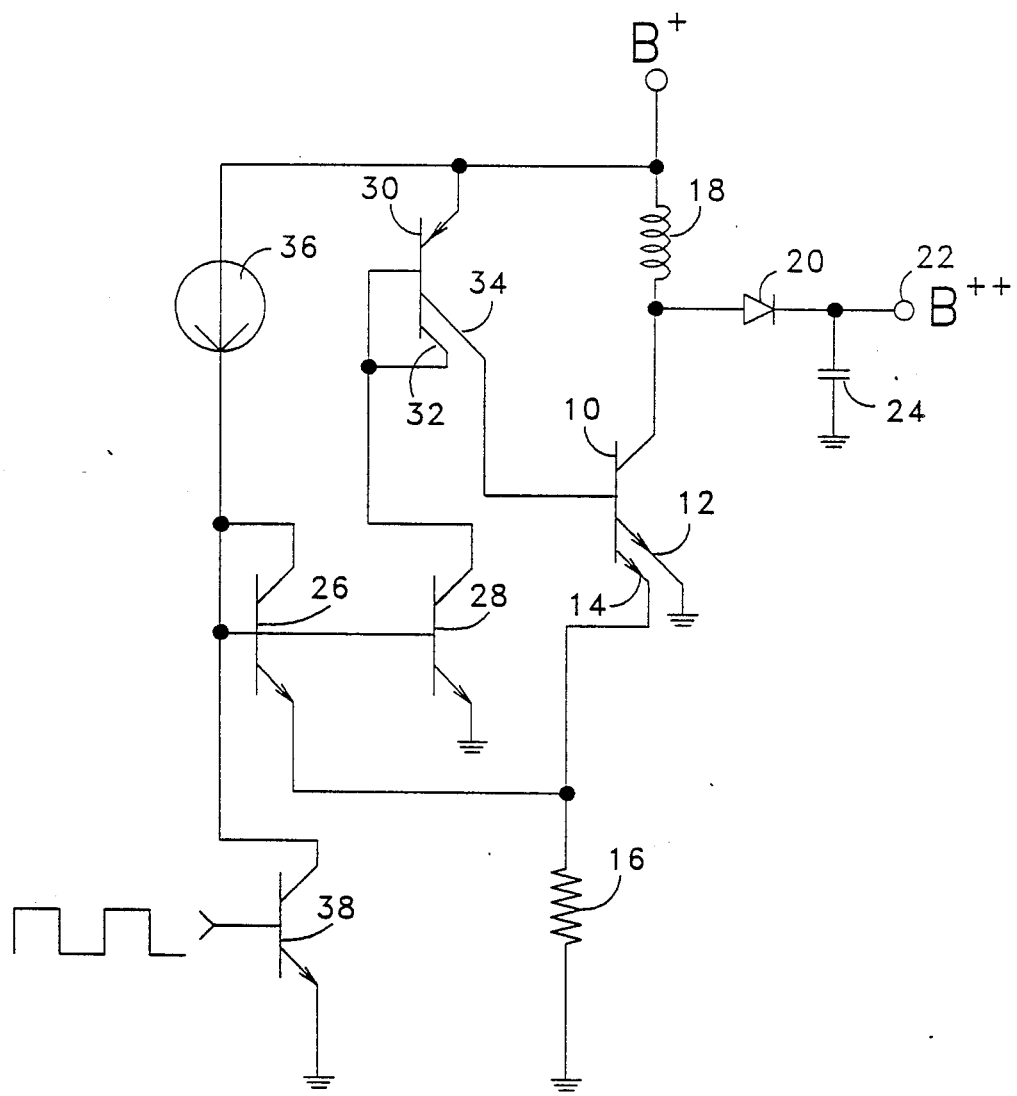
FIG. 1 is a schematic diagram of the inventive switching circuit.

The drawing is a schematic diagram of a switching transistor and associated base drive circuit suitable for use in a DC-DC switching regulator. A coil switching transistor means (NPN transistor 10) has a first emitter 12 coupled to a first source of a supply voltage (in this case ground) and a second emitter 14 coupled to ground via resistor 16. The collector of transistor 10 is coupled via an inductive load (in this case coil 18) to a second source of supply voltage (B+). The collector of transistor 10 is also coupled via diode 20 to output terminal 22 at which a desired output voltage B++ (typically 3.1V whereas B+ is typically 1.3V) appears. A capacitor 24 is coupled between output terminal 22 and ground.

A base drive circuit means is comprised of NPN transistors 26 and 28 and PNP transistor 30. The base and collector terminals of transistor 26 are coupled together and to the base of transistor 28. The emitter of transistor 26 is coupled to emitter 14 of switching transistor 10. In this manner, the voltage developed across resistor 16 is fed back to the emitter of transistor 26.

The emitter of transistor 28 is coupled to ground, and the collector of transistor 28 is coupled to the base of PNP transistor 30. Transistor 30 has an emitter coupled to B+, a first collector 32 coupled to the base of transistor 30 and a second collector 34 coupled to the base of switching transistor 10.

A bias current source 36 is coupled between B+, the base of transistor 26 and the collector of an input transistor 38. The emitter of NPN transistor 38 is coupled to ground while its base is coupled to a source of a rectangular input voltage or current as is shown in the drawing.

The ratio of the emitter areas of emitters 12 and 14 of transistor 10 (e.g. 8 to 1) and the value of the current sensing resistor 16 (e.g. 173 ohms) are selected as such that the voltage drop across resistor 16 will be a predetermined value (for example 54 mV) when the maximum desired current is flowing through coil 18. The voltage developed across current sensing resistor 16 will be a nonlinear representation of the current flowing through coil 18.

Transistors 26, 28 and 30 and bias current source 36 provide base current drive to transistor 10 when input transistor 38 is switched off. That is, when input transistor 38 is switched off, current being generated by current source 36 will be supplied to the base of transistor 26. When input transistor 38 is on, base drive will be diverted away from transistor 26.

Transistors 26 and 28 form a current mirror circuit whose gain is controlled by the voltage feedback from resistor 16. Transistor 30 is a split collector transistor with one collector tied back to its base to form a current mirror having stabilized gain. The combined gain of the first and second current mirrors is chosen sufficiently high such that the bias current from current source 36 can be reduced to a level which will permit the voltage developed across resistor 16 at zero coil current to be relatively small in comparison with the voltage developed across the resistor at maximum coil current. To minimize the current drain of the base drive circuit, it is preferable to increase the gain of the second current mirror rather than the first.

Figure 2:
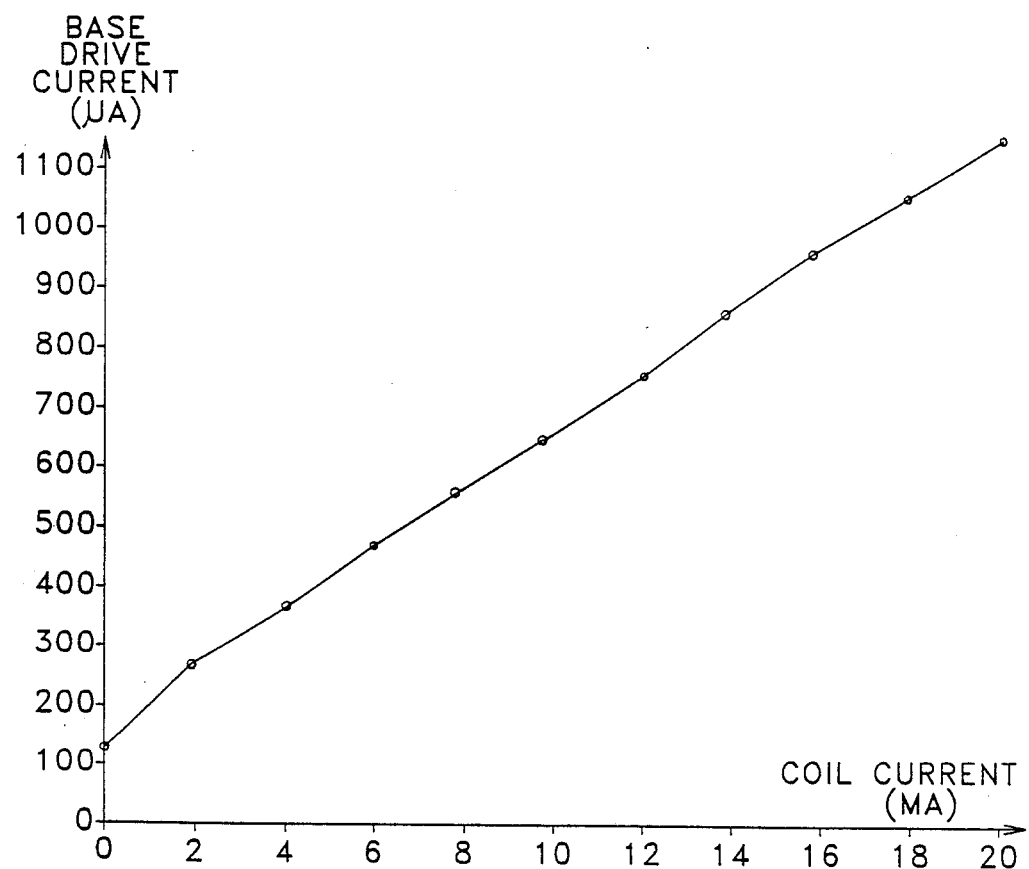
FIG. 2 is a curve illustrating the generally linear relationship between coil current and base drive current.

The voltage feedback from current sensing resistor 16 to the emitter of transistor 26 causes the gain of the current mirror formed by transistors 26 and 28 to increase when the current through coil 18 increases. The nonlinear gain versus the emitter voltage of the current mirror formed by transistors 26 and 28 compensates for the nonlinear and opposite characteristic of the voltage across sensing resistor 16 versus the coil current. This results in a current mirror gain (transistors 26 and 28) which is a substantially linear function of the coil current. Therefore, when input transistor 38 is off, transistor 30 will provide a base drive current to coil switching transistor 10 which is automatically adjusted by means of a feedback voltage to track the instantaneous coil current in a substantially linear fashion as is shown in FIG. 2. This minimizes the base current to switching transistor 10 and optimizes the total current drain of the circuit.

The above description is given by way of example only. Changes in form and details may be made by one skilled in the art without departing from the scope of the invention as defined by the dependent claims.

What is claimed is:

1. An inductively loaded switching circuit, comprising:
    an inductive load;
    switching transistor means coupled to said inductive load for conducting current flowing through said inductive load when said switching transistor is in a conductive state, said switching transistor means having a first emitter for coupling to a first source of supply voltage, and having a second emitter;
    a drive circuit coupled to said switching transistor means for supplying a drive current thereto; and
    feedback means coupled to said second emitter and to said drive circuit for varying said drive current.

2. A circuit according to claim 1 wherein said drive current is varied substantially linearly with respect to the current flowing through said inductive load.

3. A circuit according to claim 2 further comprising input circuit means for alternately enabling and disabling said drive circuit.

4. A circuit according to claim 3 wherein said switching transistor means comprises a first transistor means having said first and second emitter and having a collector coupled to said inductive load and a base coupled to said drive circuit.

5. A circuit according to claim 4 wherein said drive circuit comprises:
    first current mirror means coupled to said input circuit means and to said feedback means; and
    second current mirror means coupled to said first current mirror means and to the base of said first transistor means.

6. A circuit according to claim 5 wherein said first current mirror means comprises:
    a second transistor means having a base coupled to said input circuit means, a collector coupled to its base, and an emitter coupled to said feedback means; and
    a third transistor means having an emitter for coupling to said first source of supply voltage, a base coupled to the base of said second transistor means and a collector coupled to said second current mirror means.

7. A circuit according to claim 6 wherein said second current mirror means comprises fourth transistor means having an emitter for coupling to a second source of supply voltage, a base coupled to the collector of said third transistor means, a first collector coupled to its base, and a second collector coupled to the base of said first transistor means.

8. A circuit according to claim 7 wherein said input circuit means comprises:
    fifth transistor means having an emitter for coupling to said first source of supply voltage, a base for receiving a periodic enabling signal, and a collector coupled to the base of said second transistor means; and
    a current source for coupling between said second source of supply voltage and the collector of said fifth transistor means.

9. A circuit according to claim 8 wherein said first, second, third, and fifth transistor means are NPN transistors and said fourth transistor means is a PNP transistor.

10. A circuit according to claim 8 wherein said feedback means includes a resistor for coupling between said second emitter of said first transistor means and said first source of supply voltage.

* * * * *